April 21, 1964 W. D. SCHMITZ 3,129,991

PRINTED CIRCUIT CARD RACK ASSEMBLY

Filed Dec. 14, 1960 3 Sheets-Sheet 1

Inventor:
William D. Schmitz,
by Gust & Irish
Attorneys.

April 21, 1964 W. D. SCHMITZ 3,129,991

PRINTED CIRCUIT CARD RACK ASSEMBLY

Filed Dec. 14, 1960 3 Sheets-Sheet 2

Inventor:
William D. Schmitz,
by Gust & Irish
Attorneys.

April 21, 1964 W. D. SCHMITZ 3,129,991

PRINTED CIRCUIT CARD RACK ASSEMBLY

Filed Dec. 14, 1960 3 Sheets-Sheet 3

Inventor:
William D. Schmitz,
by Gust & Irish
Attorneys.

United States Patent Office 3,129,991

Patented Apr. 21, 1964

3,129,991
PRINTED CIRCUIT CARD RACK ASSEMBLY

William D. Schmitz, Fort Wayne, Ind., assignor to International Telephone and Telegraph Corporation Filed Dec. 14, 1960, Ser. No. 75,785
15 Claims. (Cl. 339—17)

This invention relates generally to cabinets or racks for mounting electronic apparatus, and more particularly to a rack assembly for removably mounting circuit cards.

In certain types of complex electronic apparatus, it is a common practice to mount various circuit components on a circuit card or board which has a multiple contact connector or plug part thereon, the circuit components being connected to the connector part by conventional wiring techniques, such as printed circuit conductors on the circuit card, a plurality of such cards being removably supported in a rack assembly having connector parts respectively mating with the connector parts on the circuit cards. In prior circuit card rack assemblies known to the present applicant, the connector parts on the circuit cards have been located at the ends of the cards which are inserted in the rack assembly with the corresponding connector parts on the rack assembly and the cabling connected thereto being positioned at the rear of the rack assembly. With such prior arrangements, in order to provide for operational testing of the apparatus, it was necessary to provide access to the back of the rack assembly in order to make test connections to the connector parts thereon which precluded positioning the rack assembly with its back abutting the wall, thus adding to the overall space requirement of the equipment. In the alternative, separate cabling has been provided in order to bring out test points on the front of the rack assembly or parallel conductors have been provided on the circuit cards themselves from the back to the front in order to provide test points accessible from the front of the rack. Further, in such prior circuit card rack assemblies, with the circuit cards in their operative position, individual components on the cards were not accessible for operational testing, and thus, card extenders were provided having connector parts mating respectively with the rack connector parts and with the circuit card connector part extending across the space within the rack normally occupied by the circuit card in order to position the card in front of the rack so that the individual components thereon would be available for operational testing, parallel conductors being provided on the card extender interconnecting its two sets of connector parts. In addition to the obvious disadvantages of such prior systems with respect to space requirements and the necessity for providing card extenders to mate with each circuit card, the additional length of parallel conductors for bringing out test points to the front of the rack and for providing operational testing of individual components on the circuit cards adds appreciable lumped impedance, thus generally precluding their employment in a higher frequency circuit.

It is accordingly an object of my invention to provide an improved circuit card rack assembly which eliminates need for access to the rear of the rack and card extenders, and in which all cabling and test points are readily accessible at the front of the rack.

My invention in its broader aspects provides a circuit card rack assembly having a frame with first connector means having contact elements on the frame. A circuit card is provided for supporting circuit elements and second connector means having contact elements is provided on the circuit card for removably engaging the contact elements of the first connector means, one of the connector means having its contact elements exposed on two opposite sides thereof. In accordance with my invention, the circuit card has a first position projecting on one side of the frame with the contact elements on one side of the one connector means engaging the contact elements of the other connector means, and a second position projecting on the other side of the frame with the contact elements on the opposite side of the one connector means engaging the contact elements of the other connector means.

The above-mentioned and other features and objects of this invention and the manner of attaining them will become more apparent and the invention itself will be best understood by reference to the following description of an embodiment of the invention taken in conjunction with the accompanying drawings, wherein.

Figures 1, 2:
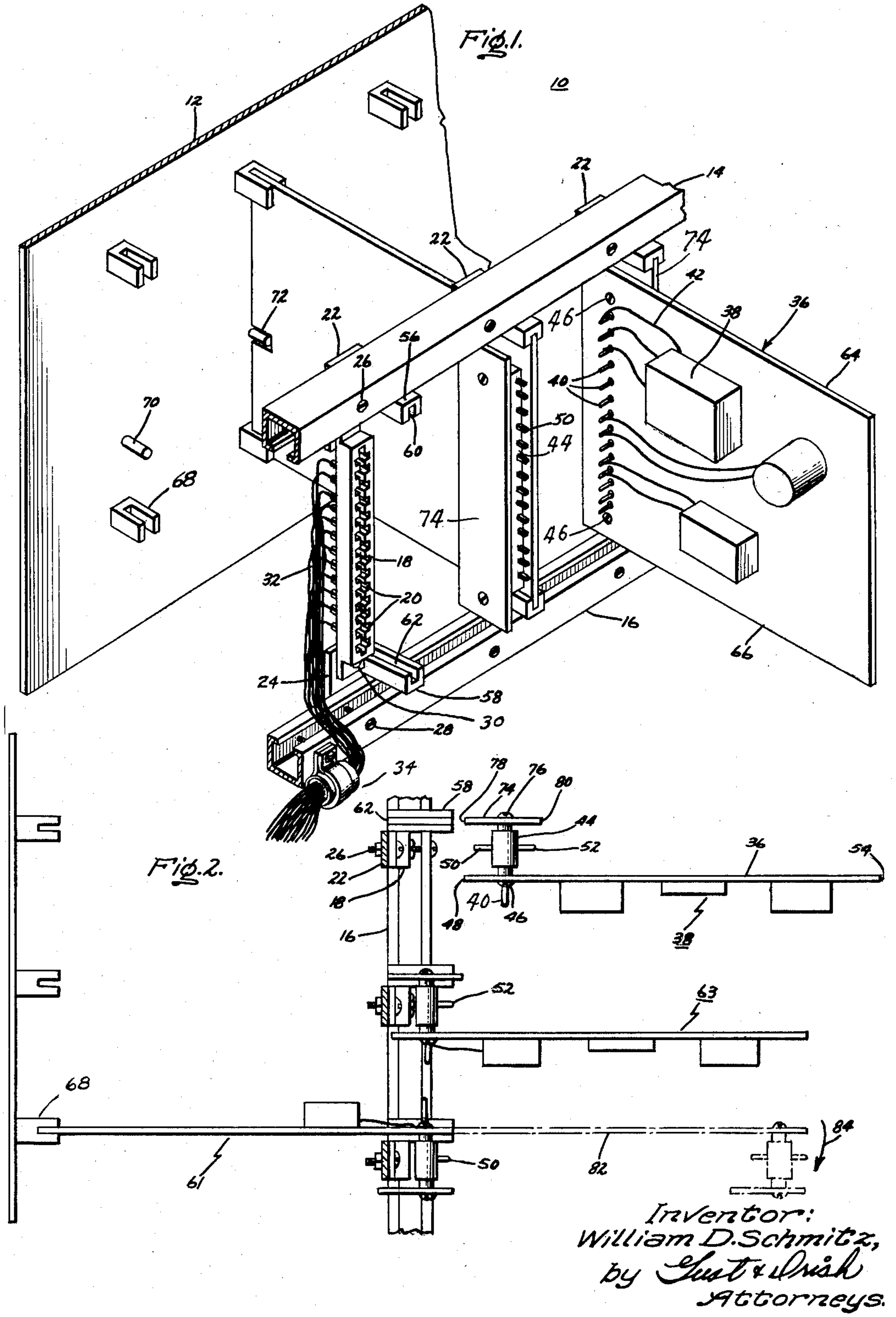
FIG. 1 is a view in perspective illustrating one embodiment of my invention.
FIG. 2 is a top view of the embodiment of FIG. 1 with top rail 14 and guide members 56 omitted.

Referring now to FIGS. 1 and 2, my improved circuit card rack assembly, generally shown at 10, comprises a rear panel member 12 which, it will be seen, may be arranged abutting a wall of a room or compartment, and two vertically spaced parallel frame members 14 and 16, which may be channels as shown, spaced forwardly from the rear panel 12.

A plurality of multiple contact connector parts 18 are provided, each being shown as having a plurality of longitudinally spaced female contact elements 20 facing forwardly from the members 14 and 16, i.e., away from the rear panel 12. Connector parts 18 are mounted on the members 14 and 16 in horizontally spaced relationship by means of members 22 and 24, members 22 being secured to the rear side of frame member 14 in any suitable manner, as by threaded fasteners 26, and members 24 being likewise secured to the rear side of frame member 16 by threaded fasteners 28, connector parts 18 being in turn secured to the members 22 and 24 by threaded fasteners 30. Electrical leads 32 are respectively connected to the contact elements of connector parts 18 and are cabled, as shown, being secured to frame members 16 by suitable clamps 34, as shown. It will now be readily apparent that by virtue of mounting of connector parts 20 at the front of rack 10, the connection of electrical leads 32 to the contact elements of the connector parts 18 may be readily accomplished by merely removing threaded fasteners 26 and 28 thereby permitting the connector part 18 to be removed at the front of the rack.

Figure 3:
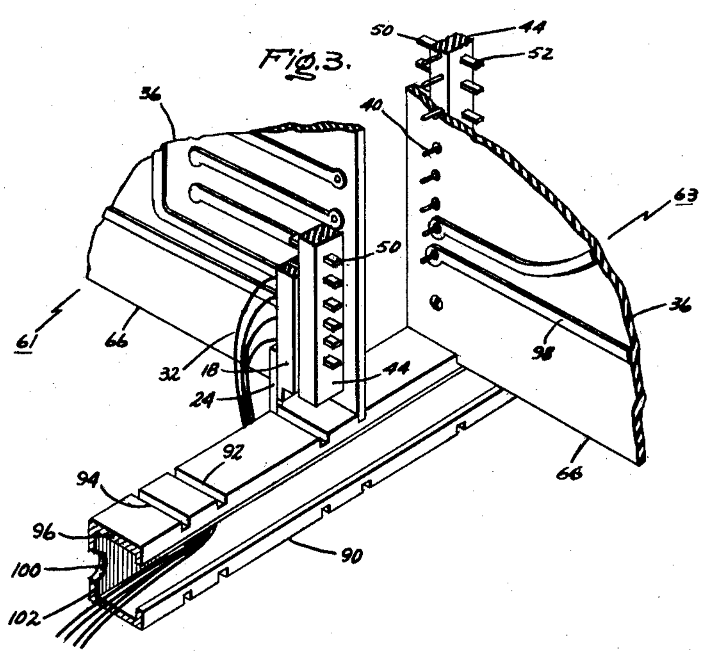
FIG. 3 is a fragmentary view in perspective illustrating a modification of my invention.

A plurality of generally rectangular relatively thin circuit cards 36 are provided, conventionally formed of fiberglass-reinforced resin material. Circuit components schematically shown as 38 are mounted on one side of the boards 36, and are connected to terminal pins 40 by electrical leads 42 which may be either conventional hookup wire, or printed circuit conductors adhered to the surface of boards 36, as seen in FIG. 3 it being understood that the particular circuit components mounted on the boards 36 and their manner of connection to the terminal pins 40 does not form a part of my invention.

Each of the circuit boards 36 has an elongated multiple contact connector part 44 mounted on its side opposite from the components 38 in any suitable manner, as by threaded fasteners 46, as shown in FIG. 2, connector part 44 being disposed adjacent end 48 of board 36 and parallel therewith. Connector part 44 is provided with a plurality of longitudinally spaced male contact elements having portions 50 and 52 exposed on opposite sides thereof, i.e., portions 50 extend toward end 48 of board 36 and portions 52 extend toward the other end 54.

Guide members 56 and 58 are respectively mounted on the facing sides of frame members 14 and 16 on the side of connector parts 18, as shown, guide members 56 and 58 respectively having slots 60 and 62 formed therein and extending transversely of the frame members 14 and 16.

Circuit cards 36 are selectively removably mounted on the rack assembly 10 in first positions 61 and second positions 63 as seen in FIG. 2. In the first positions 61, the top and bottom edges 64 and 66 of the circuit card 36 are inserted in slots 60 and 62 of guide members 56 and 58, respectively, with end 54 facing rear panel 12 and the circuit card is then slid toward the rear panel 12 until contact portions 52 of connector part 44 engage contact elements 20 of connector part 18. In this position, it will be seen that circuit board 36 extends transversely across the space between panel 12 and frame members 14 and 16 being substantially entirely enclosed therein. In order to support the ends 54 of circuit cards 36 in their first or enclosed positions, slotted guide members 68 are provided mounted on the inner surface of rear panel 12, as shown. Further, in order to key cards 36 so that only the correct circuit card may be inserted in a particular pair of guide members 56 and 58 with its connector 44 mating with the respective connector 18, keying pins 70 are provided extending inwardly from the inner surface of rear panel 12 and mating with corresponding keying slots 72 formed in end 54 of the circuit cards 36.

In order to provide for mounting the circuit cards 36 in their second or exterior positions 63, each of the circuit cards 36 is provided with a guide card 74 secured to the side of connector part 44 remote from circuit card 36 in any suitable manner, as by threaded fasteners 76, and it will thus be seen that guide cards 74 are in spaced parallel relationship with the circuit cards 36. Guide cards 74 have the same width as circuit cards 36 with their ends 78 being in alignment with ends 48 of circuit cards 36 but with their other ends 80 spaced from ends 54, as shown. It will be seen that portions 50 and 52 of the contact elements of connector part 14 are spaced inwardly from ends 78 and 80 of guide cards 74, connector part 44 in essence being positioned midway between the ends 78 and 80 of the guide card.

In order to move the card 36 from its first position 61 to its second position 63, the card is pulled out of the rack 10, as shown in dashed lines 82 in FIG. 2, rotated end-for-end as shown by the arrow 84, without however, being inverted. End 78 of guide card 74 is then inserted in slots 60 and 62 in guide members 56, 58 with contact element portions 50 of connector part 44 being engaged with the corresponding contact elements 20 of connector part 18. It will now be seen that in the second position 63 of circuit cards 36, the card is substantially positioned outside of rack 10 with components 38 readily accessible for operational testing while the circuit card is energized.

Figure 8:
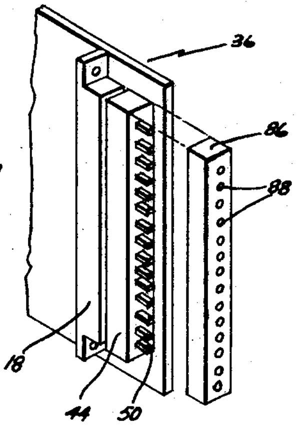
FIG. 8 is a fragmentary view in perspective illustrating a feature of my invention.

Since each contact element of connector part 44 of circuit card 36 has its portions 50 and 52 connected together, it will readily be seen that in the first or interior position 61 of the circuit cards, portions 50 of the contact elements of connector part 44 are readily accessible to the exterior of the rack for operational testing, while the particular circuit card is energized, and that likewise, connector parts 52 are exposed for operational testing when the circuit cards are in their second or exterior position 63. In order to facilitate such operational testing, another connector part 86 may be provided for connection to the contact element portions 50 or 52 of connector part 44, as shown in FIG. 8, connector part 86 having female contact elements (not shown) respectively cooperatively engaging contact element portions 50 or 52, depending upon the position of board 36, and having openings 88 in its side opposite from its contact elements for inserting test prods therein. It will also be readily apparent that a connector part having cabled leads connected thereto and in turn connected to suitable test apparatus may be provided for engagement with the exposed contact element portions 50 or 52 of connector part 44 for operational testing. It will be seen, however, that whatever means of making connection to the exposed contact element portions 50 or 52 is provided, test points of the circuit card 36 are readily accessible at the front of the rack assembly 10 whichever position the circuit cards are in without the necessity for providing additional lengths of parallel conductors thereby adding lumped impedance to the system.

Referring now to FIG. 3 in which like elements are indicated by like reference numerals, here the horizontal members are shown as being in the form of a channel 90 having its open side facing away from the rear panel. Here, a pair of transverse grooves 92 and 94 are formed in upper side 96 of channel 90 respectively on each side of connector part 18. With this arrangement, the guide card 74 of FIGS. 1 and 2 may be eliminated. Thus, in the first position 61 of circuit cards 36, the top and bottom edges 64 and 66 of circuit cards 36 are slidably seated in grooves 92 with contact element portions 52 of connector part 44 cooperatively engaging the contact elements 20 of connector part 18, and in the second or exterior position 63, the top and bottom edges 64 and 66 of the circuit cards 36 are slidably seated in the grooves 94 with contact element portions 50 of connector part 44 cooperatively engaging contact elements 20 of connector part 18. In the embodiment of FIG. 3, the circuit cards 36 are shown as having printed circuit conductors 98 thereon, rather than the hook-up wire conductors 42 shown in FIG. 1. Here also, the cabled leads 32 which are respectively connected to the contact elements 20 of connector part 18 are carried through openings 100 in the web portion 102 of channel 90 and are then carried along the interior of the channel.

Figure 4:
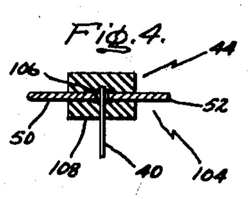
FIG. 4 is a fragmentary cross-sectional view illustrating one form of connector part usuable in my invention.

Referring now to FIG. 4, the connector part 44 is shown as comprising a unitary contact element 104 with end portions 50 and 52 and with a central opening 106 therein through which terminal pin 40 is inserted and secured thereto as by soldering, contact elements 104 and terminal pins 40 being held in assembled relation by block 108 formed of suitable insulating material. Reference to FIGS. 1 and 3 will reveal that the terminal pins 40 extend from the connector part 44 through the circuit card 36 with hook-up wires 42 or printed circuit conductors 98 being respectively electrically secured thereto in any suitable manner, as by soldering. The contact elements of connector parts 18 and 44 shown in FIGS. 1 through 4 will be recognized as being of the "Amphenol" type.

Figure 5:
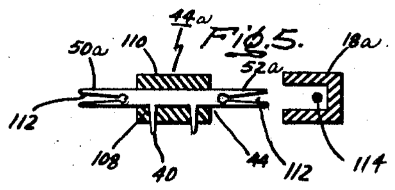
FIG. 5 illustrates another form of connector usable in my invention.
Figure 6:
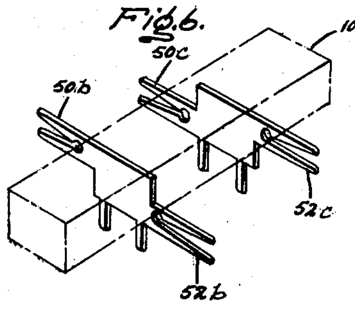
FIG. 6 illustrates still another form of connector which may be employed in my invention.
Figure 11:
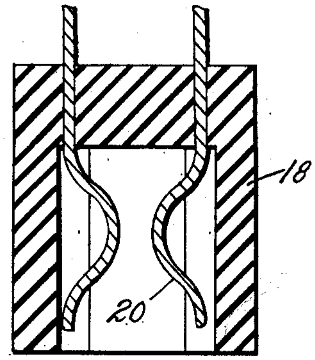
FIGURE 11 is a top cross sectional view showing a typical construction for connector part 18.

Referring now to FIG. 5, connector parts 18*a* and 44*a* are shown as including contact elements of the "Elco" type. Here, contact elements 110 have slots 112 formed in their portions 50*a* and 52*a* which respectively cooperate with pins 114 formed in the connector part 18*a*. As shown in FIG. 6, the contact element arrangement of FIG. 5 may be further modified by providing staggered portions 50*b*, 50*c*, and 52*b*, 52*c*, which staggered contact element portions engage correspondingly staggered contact elements in the cooperating connector part.

Figure 7:
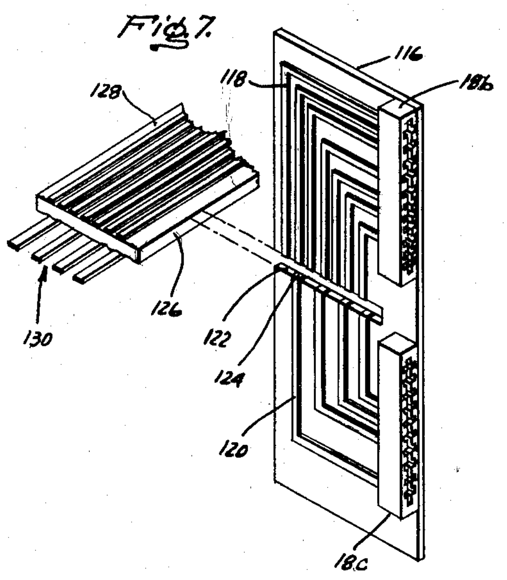
FIG. 7 is a fragmentary view in perspective illustrating another modification of my invention.

Referring now to FIG. 7, there is shown an arrangement in which the cabling 32 of the previous figures is replaced by printed circuit boards. It will be readily comprehended that in the arrangements of the previous figures, several rows of printed circuit cards 36 can be vertically disposed one over the other. Thus, in FIG. 7, two vertically aligned connector parts **18*b* and 18*c* are shown for receiving corresponding circuit cards 36 in either their first or second positions, as described above. Here, a printed circuit card 116 is provided having printed circuit conductors 118 and 120 thereon formed in any conventional manner. Connector parts 18*b* and 18*c* are disposed immediately adjacent printed circuit board 116 and printed circuit conductors 118 and 120 are respectively connected to corresponding contact elements of connector parts 18*b* and 18*c*. Transverse slot 122 is formed in the printed circuit board 116 separating the conductors 118 and 120 but with these conductors respectively extending onto the edges of the slot, as at 124. Another printed circuit board 126 is provided having printed circuit conductors 128 and 130 on its opposite sides as shown, the conductors 128 and 130 respectively being aligned with the portions 124 of the printed circuit board 116. It will now be readily comprehended that printed circuit board 126 is inserted in the slot 122 so that its conductors 128 and 130 respectively electrically engage portions 124 of conductors 118 and 120**.

Figure 9:
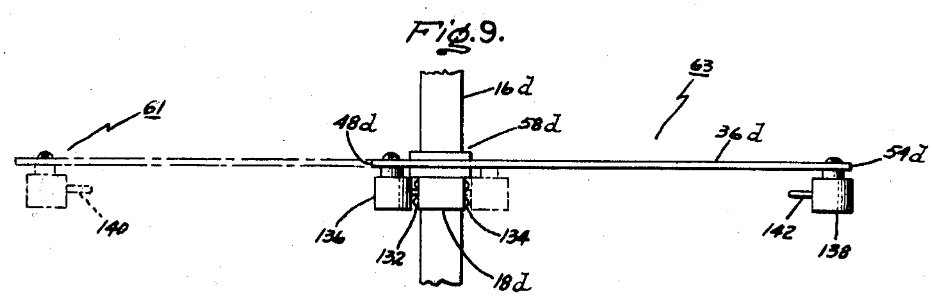
FIG. 9 is a fragmentary top view showing another embodiment of my invention.
Figure 10:
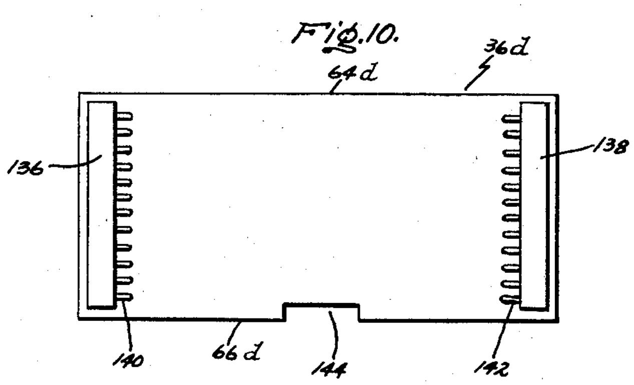
FIG. 10 is a side view of the circuit card employed in the embodiment of FIG. 9.

Referring now to FIGS. 9 and 10, in which like elements are again indicated by like reference numerals with the suffix "*d*", ther is shown another embodiment of my invention in which the connector part **18*d* on parallel frame members 14*d* and 16*d* is provided with female connector portions 132 and 134 on opposite sides thereof. Here, circuit 36*d* is provided with a pair of connector parts 136 and 138 mounted on one side thereof adjacent its ends 48*d* and 54*d*. The connector parts 136 and 138 respectively have male contact elements 140 and 142 extending toward each other parallel with the card, as shown. It will now be seen that the top and bottom edges 64*d* and 66*d* of the circuit card 36*d* are slidingly seated in the grooves 60 and 62 in guide members 56 and 58 and that when the board 36*d* is in its first or interior position 61, as shown in dashed lines in FIG. 9, the male contacts 142 of connector part 138 respectively cooperatively engage the female contact element portions 134 of connector part 18*d*, whereas when the board 36*d* is in its exterior positon 63, the male contact elements 140 of connector part 136 cooperatively engage the femal contact element portions 132 of connector part 18*d*. In this embodiment, a cut-out portion 144 is formed in the bottom edge 66*d* of the card 36*d* in order to clear guide member 58*d* to permit complete removal of the card from the rack. The arrangement shown in FIGS. 9 and 10 does require the provision of parallel conductors respectively interconnecting the contact elements 140 and 142 of connector parts 136 and 138 on circuit card 36*d***, thus ordinarily precluding employment of the embodiment of FIGS. 9 and 10 for higher frequency application.

It will now be seen that my invention completely eliminates the need for card extension devices for rendering the cards accessible for operational testing of components, a particularly advantageous feature in instances where the circuit cards include coaxial cable elements. It will further be seen that with the stationary connector parts mounted in front of the rack, the long card guides employed in prior circuit card rack assemblies and related alignment problems are eliminated.

While I have described above the principles of my invention in connection with specific apparatus, it is to be clearly understood that this description is made only by way of example and not as a limitation to the scope of my invention.

What is claimed is:

1. A circuit card rack assembly comprising: a frame including a vertically disposed rear frame member and a pair of vertically spaced parallel members respectively spaced from said rear frame member; first elongated multiple contact connector means extending vertically between said parallel members and secured thereto and having opposite sides, said first connector means having a plurality of vertically spaced contact elements in at least one of said opposite sides; a flat generally rectangular circuit card for supporting circuit elements; second elongated multiple contact connector means secured to one side of said circuit card parallel with one end thereof and having opposite sides, said second connector means having a plurality of contact elements in at least one side thereof in spaced parallel relationship with said one side of said card for respectively removably engaging the contact elements of said first connector means; one of said connector means having its contact elements respectively in both opposite sides thereof; and guide means on said parallel members respectively adjacent said first connector means for supporting said circuit card in a first position extending transversely from said parallel members toward said rear frame member with the contact elements on one side of said one connector means respectively engaging the contact elements of the other connector means, and in a second position extending transversely from said parallel members away from said rear frame member with the contact elements on the opposite side of said one connector means respectively engaging the contact elements of the other connector means.

2. The combination of claim 1 wherein said one connector means is the second connector means.

3. The combination of claim 1 wherein said one connector means is the first connector means, and wherein the second connector means comprises first and second connector parts spaced apart on said circuit card and each having contact elements, said first connector part having its contact elements engaging the contact elements on said one side of said first connector means in said first position of said circuit card, said second connector part having its contact elements engaging the contact elements on said opposite side of said first connector means in said second position of said circuit card.

4. The combination of claim 1 further comprising means on said rear frame member for supporting one end of said circuit card in the first position thereof.

5. The combination of claim 1 further comprising cooperating keying means on said rear frame member and one end of said circuit card for insuring that the correct circuit card is associated with said first connector means.

6. The combination of claim 1 wherein said parallel members are channels, and wherein electrical leads are respectively connected to the contact elements of said connector means and are disposed in at least one of said channels.

7. The combination of claim 1 wherein the contact elements of said second connector means having portions extending through said circuit card for attaching said circuit elements thereto.

8. The combination of claim 1 further comprising a first printed circuit board having conductors thereon and disposed adjacent said first connector means in a plane parallel therewith and with said circuit card, the contact elements of said first connector means being respectively connected to the conductors of said first printed circuit board; and a second printed circuit board having conductors thereon and disposed generally at right angles to said first printed circuit board and spaced from one end of said first connector means, said conductors of said printed circuit boards being respectively interconnected.

9. A circuit card rack assembly comprising: a rack having rear and front sides defining an interior space therebetween, said rear side being defined by a rear frame member and said front side being defined by two spaced parallel members lying in a plane spaced from said rear frame member; a first elongated multiple contact connector part extending transversely between said parallel members and secured thereto, said first connector part having a plurality of longitudinally spaced contact elements on the side thereof away from said rear frame member; a flat generally rectangular circuit card for supporting circuit elements; a second elongated multiple contact connector part secured to one side of said circuit card parallel with and adjacent one end thereof, said second connector part having a plurality of contact elements for respectively removably engaging the contact elements of said first connector part, each of the contact elements of said second connector part having a first portion exposed on the one side of said connector part adjacent said one side thereof and a second portion exposed on the opposite side of said second connector part; and a guide means on said parallel members respectively adjacent said first connector part for supporting said circuit card between and transverse to said parallel members and parallel with said first connector part, said circuit card having a first position extending from said parallel members toward said rear frame member and being substantially disposed in said space with said second portion of the contact elements of said second connector part respectively engaging the contact elements of said first connector part, and a second position extending from said parallel members away from said rear frame member and being substantially outside of said space with said first portions of the contact elements of said second connector part respectively engaging the contact elements of said first connector part.

10. The combination of claim 9 wherein said guide means comprises two parallel grooves respectively extending transversely across each of said parallel members on opposite sides of said first connector part, and wherein said circuit card in its first position is seated in one pair of corresponding grooves in said parallel members and is seated in the other pair of corresponding grooves in its second position.

11. The combination of claim 9 further comprising a flat guide card secured to the side of said second connector part remote from said circuit card and parallel therewith and having substantially the same width on said circuit card, wherein said guide means comprises grooved members on each of said parallel members on the same side of said first connector part, and wherein one of said cards is seated in said grooved members in the first position of said circuit card and the other of said cards is seated in said grooved members in the second position of said circuit card.

12. The combination of claim 11 wherein one end of said guide card is in alignment with said one end of said circuit card and said guide card is substantially shorter in length than said circuit card, and wherein said one end of said guide card and the opposite end thereof extend respectively beyond said first and second portions of said second connector part.

13. A circuit card rack assembly comprising: a rack having rear and front sides defining an interior space therebetween, said rear side being defined by a rear frame member and said front side being defined by two spaced parallel members lying in a plane spaced from said rear frame member; a first elongated multiple contact connector part extending transversely between said parallel members and secured thereto, said first connector part having a plurality of longitudinally spaced contact elements each having a first portion exposed on the side thereof facing said rear frame member and a second portion exposed on the opposite side thereof; a flat generally rectangular circuit card for supporting circuit elements; second and third connector parts secured to one side of said circuit card respectively parallel with and adjacent opposite ends thereof, said second and third connector parts each having a plurality of contact elements respectively facing each other for respectively removably engaging the contact elements of said first connector part; and guide means on said parallel members respectively adjacent said first connector part for supporting said circuit card between and transverse to said parallel members and parallel with said first connector part, said circuit card having a first position extending from said parallel members toward said rear frame member and being substantially disposed in said space with the contact elements of one of said second and third connector parts engaging the second portions of the contact elements of said first connector part, and a second position extending from said parallel members away from said rear frame member and being substantially outside of said space with the contact elements of the other of said second and third connector parts engaging the first portions of the contact elements of said first connector part.

14. The combination of claim 13 wherein said circuit card has a cut-out portion in an edge thereof intermediate said opposite ends, said cut-out portion being longer than said guide means to thereby permit removal of said circuit card therefrom.

15. In combination: a generally rectangular flat circuit card, an elongated multiple contact connector part secured on one side of said circuit card parallel with and adjacent one end thereof, said connector part having a plurality of longitudinally spaced contact elements each having a first portion exposed on the side of said connector part facing said one end of said circut card and a second portion exposed on the opposite side of said connector part, and a flat guide card secured to the side of said connector part remote from said circuit card, said guide card having substantially the same width as said circuit card with one end thereof in alignment with said one end of said circuit card, said guide card being shorter than said circuit card, both ends of said guide card extending beyond said first and second contact element portions respectively.

References Cited in the file of this patent

UNITED STATES PATENTS

| | | |
|---|---|---|
| 1,896,743 | Dieux | Feb. 7, 1933 |
| 2,858,515 | Thunander et al. | Oct. 28, 1958 |
| 2,864,977 | Witt et al. | Dec. 16, 1958 |
| 2,925,537 | Winkler | Feb. 16, 1960 |
| 2,947,914 | Simons | Aug. 2, 1960 |
| 2,994,056 | Fox | July 25, 1961 |